United States Patent [19]

Veranth et al.

[11] 3,859,570

[45] Jan. 7, 1975

[54] POWER TRANSISTOR MOUNTING

[75] Inventors: Joseph L. Veranth, Marlboro; Louis Poulo, Wayland, both of Mass.

[73] Assignee: Bose Corporation, Framingham, Mass.

[22] Filed: Feb. 20, 1973

[21] Appl. No.: 333,975

[52] U.S. Cl. .......... 317/100, 317/101 C, 317/234 A

[51] Int. Cl. .......... H02b 1/00

[58] Field of Search .......... 317/100, 101 C, 234 A; 174/DIG. 5

[56] References Cited

UNITED STATES PATENTS

| | | | |
|---|---|---|---|
| 3,292,050 | 12/1966 | Grossoehme | 317/100 |
| 3,327,180 | 6/1967 | Winter | 317/100 |
| 3,465,212 | 9/1969 | Grimes | 317/100 |
| 3,476,981 | 11/1969 | Burton | 317/100 |
| 3,519,889 | 7/1970 | Monaco | 317/100 |
| 3,611,046 | 10/1971 | Covert | 317/100 |
| 3,676,745 | 7/1972 | Traweek | 317/100 |

*Primary Examiner*—J. D. Miller
*Assistant Examiner*—Patrick R. Salce
*Attorney, Agent, or Firm*—Charles Hieken, Esq.; Jerry Cohen, Esq.

[57] ABSTRACT

Power transistors are mounted and machine soldered directly to a printed circuit board with a thermally conductive bracket between the transistor and the board. A thermostatic switch is mounted on the bracket and arranged for interrupting amplifier power when the bracket temperature exceeds a predetermined safe temperature. The bracket may then be secured to a heat sink.

2 Claims, 1 Drawing Figure

PATENTED JAN 7 1975
3,859,570
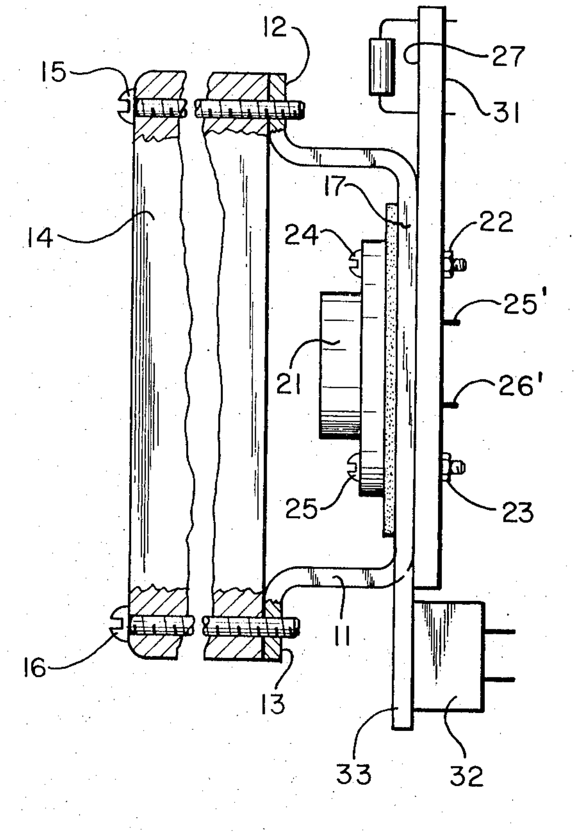

POWER TRANSISTOR MOUNTING

BACKGROUND OF THE INVENTION

The present invention relates in general to power transistor mounting and more particularly concerns novel apparatus and techniques for securing power transistors in a manner which facilitates assembly, testing and replacement where necessary while minimizing the chances of damage to the power transistor.

A typical prior art approach toward mounting power transistors for use in a power amplifier involves mounting the power transistors to a heat sink separate from the printed circuit (PC) board. The power transistor electrodes are connected to the rest of the circuit by hand wiring and soldering. Difficulties are encountered when attempting to service the PC board because the connections to the power transistors must be interrupted before completely removing the circuit board. It is thus difficult to replace the complete circuit. Typically, a thermostatic switch is mounted on the heat sink and connected in series with the power source usually a-c line to interrupt the flow of power to the amplifier when the heat sink exceeds a predetermined safe temperature.

As further background reference is made to an article on page 59 of EDN (Electronic Design News) for July 15, 1972, entitled "Sub-modular Circuit Cuts Power Supply Design Time and Costs" published after the invention disclosed and claimed in this application was actually reduced to practice in a satisfactorily operating power amplifier.

It is an important object of this invention to overcome one or more of the disadvantages enumerated above.

It is another object of the invention to provide methods and means for mounting power transistors to circuit boards which facilitate testing and servicing a power amplifier circuit board as a complete module while minimizing transistor damage when testing the circuit board without a heat sink.

It is another object of the invention to achieve one or more of the preceding objects with apparatus that is relatively easy and inexpensive to fabricate and install.

SUMMARY OF THE INVENTION

According to the invention, bracket means of high thermal conductivity is formed with an opening for accommodating leads from a power transistor. Circuit board means is secured to the bracket means by means including the power transistor with the power transistor and circuit board means sandwiching a portion of the bracket means therebetween with the foil side away from the bracket means. The bracket means is formed with portions thereof, such as end flanges, for attachment to a heat sink in good thermal contact therewith. Preferably the power transistor is located between the bracket means and the heat sink.

According to a specific feature of the invention, the power transistor is secured to the circuit board means by means including solderable conductive elements, such as brass nuts, soldered to the foil side, and nonsolderable elements, such as aluminum screws. Preferably, a thermostatic switch means is in good thermal contact with the bracket means for interrupting power when the bracket means temperature exceeds a predetermined limit value. Preferably the bracket means is formed with a flange in the plane of the opening spaced from the plane of the end flanges to which the thermostatic switch means is secured.

Numerous other features, objects and advantages of the invention will become apparent from the following specification when read in connection with the accompanying drawing, the single FIGURE of which

BRIEF DESCRIPTION OF THE DRAWING shows a side view of a bracket according to the invention shown between portions of a heat sink and PC board.

DETAILED DESCRIPTION OF PREFERRED EMBODIMENTS

With reference now to the drawing, there is shown a side view of a bracket according to the invention interposed between portions of a heat sink and PC board. Bracket 11 is formed with upper and lower flanges 12 and 13 in good mechanical and thermal contact with heat sink 14. Screws such as 15 and 16 may be used to fasten flanges 12 and 13, respectively, to heat sink 14. It may be advantageous to form flanges 12 and 13 with tapped openings for receiving a machine screw passing through heat sink 14 to facilitate assembly and disassembly.

The bight 17 of bracket 11 is formed with an opening through which power transistor 21 is secured by means including brass nuts 22 and 23 and aluminum screws 24 and 25 which do not contact bracket 11 but do contact the case of transistor 21 and hence the collector thereof. Transistor 21, if desired, can be insulated from bracket 11 by a mica wafer in a conventional manner. Base and emitter leads 25' and 26' may be soldered to PC board 27.

An advantage of the arrangement illustrated is that transistor 21 may be secured to PC board 17, and the foil side 31 of the PC board then machine soldered to secure brass nuts 22 and 23 mechanically and electrically in position. However, the aluminum screws 24 and 25 are not soldered. Hence, if power transistor 21 needs replacement, screws 24 and 25 may be unscrewed, emitter and base leads 25' and 26' heated and transistor 21 removed. A replacement power transistor may then be readily inserted using the inverse procedure. All this may occur with bracket 11 and PC board 27 detached from heat sink 14.

A thermostatic switch 32 is attached to bracket 11 at flange 33 and functions to turn off the power supply to the amplifier when the temperature of bracket 11 exceeds a predetermined safe value.

Bracket 11 may typically comprise extruded aluminum or other suitable thermally conducting material. The power transistor 21 and the means for securing it to PC board 27 including the nonsolderable screws 24 and 25 and the solderable brass nuts 22 and 23 comprise the means for securing bracket 11 to PC board 27. Bracket 11 and the associated hardware for fastening it to heat sink 14 then comprises means for fastening PC board 27 to heat sink 14 so that the entire PC board may be removed, tested and serviced as a complete module. Moreover, there is relatively little danger of damage when testing without the heat sink because thermostatic switch 32 still limits maximum bracket temperature.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Power semiconductor device mounting apparatus comprising, a power transistor, bracket means of high thermal conductivity for supporting and carrying heat from said power transistor and formed with an opening for accommodating leads from said power transistor, circuit board means for establishing electrical connection to said leads and having a foil side and secured to said bracket means by means for fastening said bracket means to said circuit board means including said power transistor, said power transistor and said circuit board means sandwiching a portion of said bracket means therebetween with said foil side away from said bracket means, said power transistor leads being soldered to said foil side, a heat sink, said bracket means formed with portions thereof for attachment to said heat sink in good thermal contact therewith, said heat sink being fastened to said bracket means in good mechanical and thermal contact therewith with said power transistor means between said bracket means and said heat sink means whereby said bracket means comprises means for fastening said circuit board means to said heat sink so that the assembly including said circuit board means and said bracket means may be removed, tested and serviced as a complete module, and thermostatic switch means in good thermal contact with said bracket means for interrupting power when the temperature of the bracket means exceeds a predetermined limit value even when said assembly is separated from said heat sink, said bracket means being formed with flanges in substantially the same plane spaced from the portion thereof formed with said opening for engagement with said heat sink and having a flange with a free end substantially in the plane of said opening with said thermostatic switching means attached to the latter flange.

2. Power transistor mounting apparatus in accordance with claim 1 and further comprising first fastening elements soldered to said foil side and second fastening elements that are not soldered coacting with said solderable elements comprising means for securing said power transistor means to said circuit board means with said bracket means therebetween.

* * * * *